US009591766B2

(12) United States Patent
Lombardi et al.

(10) Patent No.: US 9,591,766 B2
(45) Date of Patent: Mar. 7, 2017

(54) PORTABLE ELECTRONIC DEVICE CONTACT PUCK ALIGNMENT

(71) Applicant: Motorola Mobility LLC, Chicago, IL (US)

(72) Inventors: Michael J Lombardi, Lake Zurich, IL (US); Joseph L Allore, Mundelein, IL (US); Natalie J Stevens, Spring Grove, IL (US)

(73) Assignee: Motorola Mobility LLC, Chicago, IL (US)

(*) Notice: Subject to any disclaimer, the term of this patent is extended or adjusted under 35 U.S.C. 154(b) by 25 days.

(21) Appl. No.: 14/629,919

(22) Filed: Feb. 24, 2015

(65) Prior Publication Data

US 2016/0249466 A1    Aug. 25, 2016

(51) Int. Cl.
| | | |
|---|---|---|
| H05K 7/02 | (2006.01) | |
| H05K 7/04 | (2006.01) | |
| H05K 3/00 | (2006.01) | |
| H04M 1/02 | (2006.01) | |
| H05K 1/11 | (2006.01) | |
| H05K 3/40 | (2006.01) | |

(52) U.S. Cl.
CPC .......... H05K 3/007 (2013.01); H04M 1/0277 (2013.01); H05K 1/11 (2013.01); H05K 3/4015 (2013.01); *H05K 2201/10734* (2013.01); *H05K 2203/0338* (2013.01); *H05K 2203/308* (2013.01)

(58) Field of Classification Search
CPC . H05K 2201/1031; H05K 2201/10318; H05K 2201/0959; H05K 2201/10303; H05K 2201/10325

USPC ......... 361/799, 807, 809, 810, 760
See application file for complete search history.

(56) References Cited

U.S. PATENT DOCUMENTS

| | | | | |
|---|---|---|---|---|
| 5,147,209 A | * | 9/1992 | Litwin | H05K 1/141 439/70 |
| 5,279,028 A | * | 1/1994 | McKee | B23K 3/0475 219/549 |
| 5,672,062 A | * | 9/1997 | Lindeman | H01R 13/2407 439/66 |
| 5,850,693 A | * | 12/1998 | Guran | H01R 43/205 29/845 |
| 6,196,871 B1 | * | 3/2001 | Szu | H01R 43/0256 439/571 |
| 7,417,871 B2 | * | 8/2008 | Haba | H01R 12/714 361/760 |

OTHER PUBLICATIONS

Michael J. Lombardi, et al, "Modular Portable Cellular Device Layout and Connection System", U.S. Appl. No. 14/615,519, filed Feb. 6, 2015.

* cited by examiner

*Primary Examiner* — Hung S Bui
(74) *Attorney, Agent, or Firm* — Miller, Matthias & Hull LLP (57) ABSTRACT

A device interconnection system uses an indexed carrier to locate an array of contacts on an array of solder pads on a printed circuit board. In an embodiment, the PCB is indexed to a device housing in the same manner that it is indexed to the carrier, allowing the array of contacts to match and protrude through an array of holes in the housing. In a further embodiment, the housing is substantially metallic, and the array of holes in the housing are located in an insulating plate formed in the housing.

14 Claims, 9 Drawing Sheets

PORTABLE ELECTRONIC DEVICE CONTACT PUCK ALIGNMENT

TECHNICAL FIELD

The present disclosure is related generally to mobile device interconnection, and, more particularly, to a connection system and method for a portable electronic device.

BACKGROUND

Some modern cellular phones include as many features and functions as an average personal computer. Indeed, in some respects, modern cellular phones enable features that are impossible or impractical to offer on a personal computer, e.g., portable entertainment options, device motion detection applications, motion alert functions and others.

However, as devices continue to shrink in size, and consumers continue to request additional features, certain optional features and functions may be offloaded to other devices. For example, most cellular phones include a serviceable camera, but if the user requires a higher function camera, that role may be served by a separate device. The same is true for other functions that may be offered at a base level, or not at all, on a cellular phone due to size constraints or other limitations.

To this end, it is desirable in the inventors' view to be able to connect other devices to a cellular phone in a modular fashion to allow the functionality of the cellular phone to be enhanced. With this configuration, a user having a base model can attach and remove extended functionality devices depending upon their needs. However, if the base device and the extended functionality devices are to share any of a display, a power source and data when attached, then the base device and the attached device need to be electrically connected in some fashion.

One potential solution is to provide a cord with appropriate connectors at both ends to electrically interconnect the two devices. However, in the context of a compact mobile device, the use of bulky cords and plugs is not practical from the standpoint of size. Moreover, a corded connection between devices is susceptible to entanglement, damage and disconnection.

While the present disclosure is directed to a system that may eliminate some of the shortcomings noted in this Background section, it should be appreciated that any such benefit is not a limitation on the scope of the disclosed principles, nor of the attached claims, except to the extent expressly noted in the claims. Additionally, the discussion of technology in this Background section is reflective of the inventors' own observations, considerations, and thoughts, and is in no way intended to accurately catalog or comprehensively summarize the prior art. As such, the inventors expressly disclaim this section as admitted or assumed prior art with respect to the discussed details. Moreover, the identification herein of a desirable course of action reflects the inventors' own observations and ideas, and should not be assumed to indicate an art-recognized desirability.

BRIEF DESCRIPTION OF THE SEVERAL VIEWS OF THE DRAWINGS

While the appended claims set forth the features of the disclosed systems and techniques with particularity, these systems and techniques, together with their objects and advantages, may be best understood from the following detailed description taken in conjunction with the accompanying drawings of which:

DETAILED DESCRIPTION

Before presenting a detailed discussion of embodiments of the disclosed principles, an overview is given to aid the reader in understanding the later discussion. In an embodiment of the disclosed principles, a portable electronic device such as a cellular phone device includes an interconnection system for connecting to a second portable device. The interconnection system includes, in a further embodiment, an array of contacts on a device adapted for connection to a matching array of contact springs or sprung contacts on another device.

The array of contacts are connected to a printed circuit board (PCB) located against the inside rear surface of the device, and protrude through the rear surface of the housing. On a rear surface of the other device to be connected, the array of springs or sprung contacts is located and oriented so as to contact the array of contact points on the first device when the devices are mated together.

In order for such electrical contact to occur, alignment of the contact points is important, and the alignment of the individual contact points should be maintained while attaching them to the PCB and passing them through the housing. To meet this need, a carrier is provided and configured such that individual contacts may be pressed into it and retained. The contacts are held by the carrier in an array to match an array of solder pads on the PCB of the device.

In an embodiment, solder is applied to the pads on the PCB, and the array of contacts in the carrier is placed onto the array of solder pads and held in alignment while the assembly is sent through a reflow oven to ensure the bond of solder to the contacts. To maintain alignment of the contacts through the reflow process, posts on the carrier link to two holes, or a hole and slot, on the PCB. Once the reflow process is complete, the carrier is removed from the PCB, but the contacts stay connected to the PCB in the desired array configuration because of the solidified solder.

The PCB assembly may then be lowered into the device housing. In a further embodiment, the housing includes two pins located such that at least one of the pins passes through the hole on the PCB that was used to align the contact carrier. The housing also has an array of holes matching the pattern of the array of contacts on the PCB. When the PCB is inserted in the housing, the contacts pass through the holes in the housing. A ring of adhesive surrounding the array of contacts on the PCB bonds the PCB to the housing such that a water and dust seal is formed around the array of contacts.

With this overview in mind, and turning now to a more detailed discussion in conjunction with the attached figures, the systems and techniques of the present disclosure are illustrated as being implemented in a suitable computing environment, e.g., in the base device. The following device description supports embodiments and examples of the disclosed principles and should not be taken as limiting the claims with regard to alternative embodiments that are not explicitly described herein. Thus, for example, while FIG. 1 illustrates an example mobile device or module within which embodiments of the disclosed principles may be implemented, it will be appreciated that other device types may be used, including but not limited to tablet computers and other portable devices.

Figure 1:
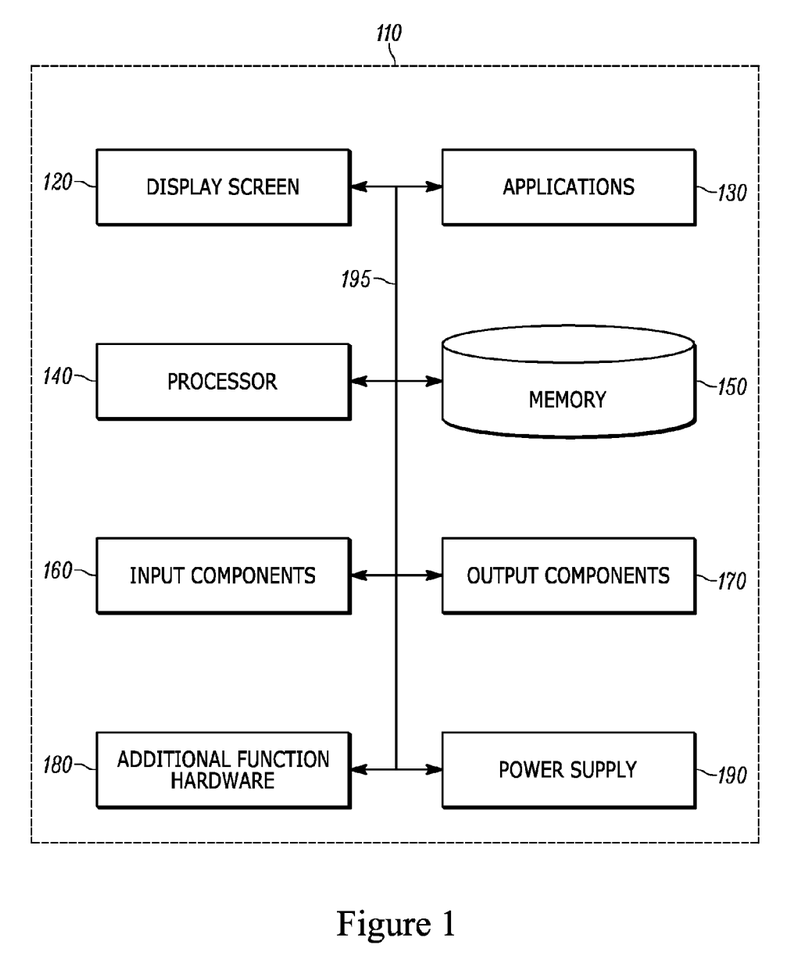
FIG. 1 is a simplified schematic of an example device with respect to which embodiments of the presently disclosed principles may be implemented.

The schematic diagram of FIG. 1 shows an exemplary set of components 110 forming part of an environment within which aspects of the present disclosure may be implemented. It will be appreciated that additional or alternative components may be used in a given implementation depending upon user preference, component availability, price point, and other considerations.

In the illustrated embodiment, the set of components 110 include a display screen 120, applications (e.g., programs) 130, a processor 140, a memory 150, one or more input components 160 such as speech and text input facilities, and one or more output components 170 such as text and audible output facilities, e.g., one or more speakers.

The processor 140 can be any of a microprocessor, microcomputer, application-specific integrated circuit, or the like. For example, the processor 140 can be implemented by one or more microprocessors or controllers from any desired family or manufacturer. Similarly, the memory 150 may reside on the same integrated circuit as the processor 140. Additionally or alternatively, the memory 150 may be accessed via a network, e.g., via cloud-based storage. The memory 150 may include a random access memory (i.e., Synchronous Dynamic Random Access Memory (SDRAM), Dynamic Random Access Memory (DRAM), RAMBUS Dynamic Random Access Memory (RDRM) or any other type of random access memory device). Additionally or alternatively, the memory 150 may include a read only memory (i.e., a hard drive, flash memory or any other desired type of memory device).

The information that is stored by the memory 150 can include program code associated with one or more operating systems or applications as well as informational data, e.g., program parameters, process data, etc. The operating system and applications are typically implemented via executable instructions stored in a non-transitory computer readable medium (e.g., memory 150) to control basic functions of an electronic device. Such functions may include, for example, interaction among various internal components and storage and retrieval of applications and data to and from the memory 150.

Further with respect to the applications, these typically utilize the operating system to provide more specific functionality, such as file system service and handling of protected and unprotected data stored in the memory 150. Although many applications may provide standard or required functionality of a user device, in other cases applications provide optional or specialized functionality, and may be supplied by third party vendors or a device manufacturer.

Finally, with respect to informational data, e.g., program parameters and process data, this non-executable information can be referenced, manipulated, or written by the operating system or an application. Such informational data can include, for example, data that are preprogrammed into the device during manufacture, data that are created by the device or added by the user, or any of a variety of types of information that are uploaded to, downloaded from, or otherwise accessed at servers or other devices with which the device is in communication during its ongoing operation.

Although not shown, the set of components 110 may include software and hardware networking components to allow communications to and from a device. Such networking components will typically provide wireless networking functionality, although wired networking may additionally or alternatively be supported.

In an embodiment, a power supply 190, such as a battery or fuel cell, may be included for providing power to the set of components 110. All or some of the internal components communicate with one another by way of one or more shared or dedicated internal communication links 195, such as an internal bus.

In an embodiment, the set of components 110 are programmed such that the processor 140 and memory 150 interact with the other components to perform a variety of functions. The processor 140 may include or implement various modules and execute programs for initiating different activities such as launching an application, transferring data, and toggling through various graphical user interface objects (e.g., toggling through various display icons that are linked to executable applications).

In a further embodiment of the disclosed principles, the illustrated set of components 110 includes one or more additional hardware groups 180. These additional hardware groups 180 include hardware supporting additional functions, with the software for such functions being included in the applications 130 and/or memory 150. Examples of such other functions include still or video camera, rear camera, flash LED, speaker, microphone, buttons, a phone vibrator, short range wireless connectivity, and so on.

Figure 2:
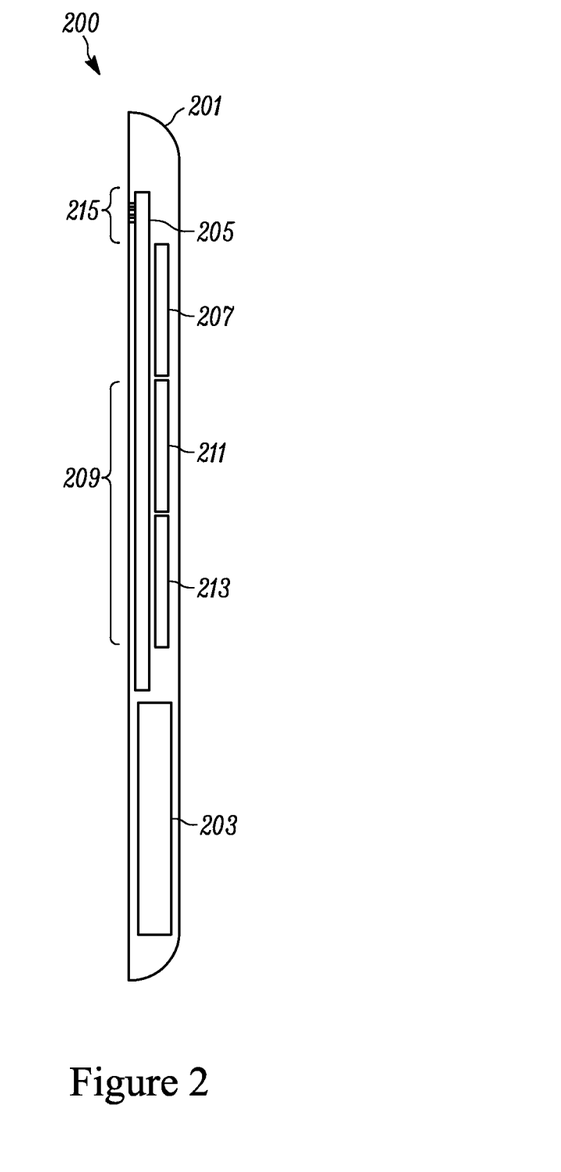
FIG. 2 is a simplified side view schematic of a portable electronic device or module in accordance with an implementation of the disclosed principles.

Turning to FIG. 2, this figure presents a simplified side view schematic of a portable electronic device or module 200 in accordance with an implementation of the disclosed principles. In the illustrated example, the device 200 includes a housing 201, within which are located a battery 203 as well as a PCB 205. The PCB 205 may be a single-sided or double-sided board, and may host a number of circuit components such as a processor 207, and one or more memory integrated circuits (ICs) 209, including RAM 211 and ROM 213 ICs or circuits.

For connecting to a second device or module, the illustrated device 200 includes an array of contacts 215. The contacts are electrically connected to convey data, commands, or other electrical information or signals to or from the PCB 205, which, through its printed leads, communicates information and signals to and from appropriate components on the board 205.

Figure 3:
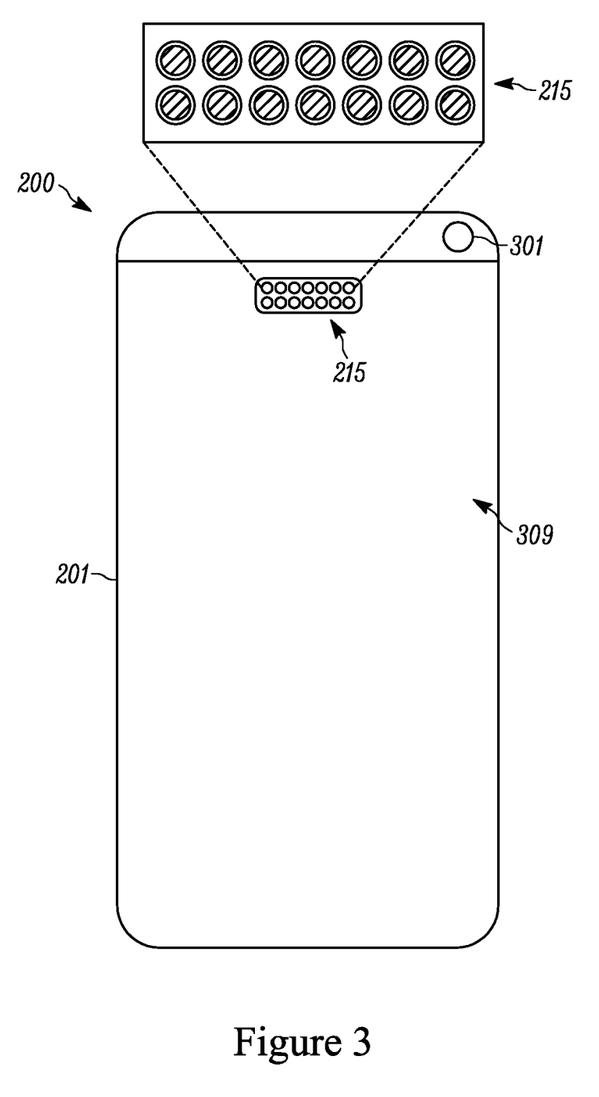
FIG. 3 is a simplified back view of the portable electronic device of FIG. 2 within which embodiments of the disclosed principles may be implemented.

Continuing, FIG. 3 is a simplified view of a back surface 309 of the portable electronic device 200 of FIG. 2. The device 200 includes, in this view, the housing 201 and the array of contacts 215. The device 200 may also include other features, such as, but not limited to, a camera aperture 301 as shown in the illustrated example. Because the back surface 309 is configured to mate to a similar back surface of another device, the display and user input elements of the device 200 are preferably located on a front surface of the device opposite the rear surface 309.

Because the array of contacts 215 is intended to contact a similar array on another device, the manner of affixing the individual contacts of the array 215 should provide accurate placement. This means that the array 215 should be properly aligned relative to both the internal electrical inputs and outputs, e.g., to or from the PCB, and relative to an array of openings in the rear surface 309 of the housing 201.

Figure 4:
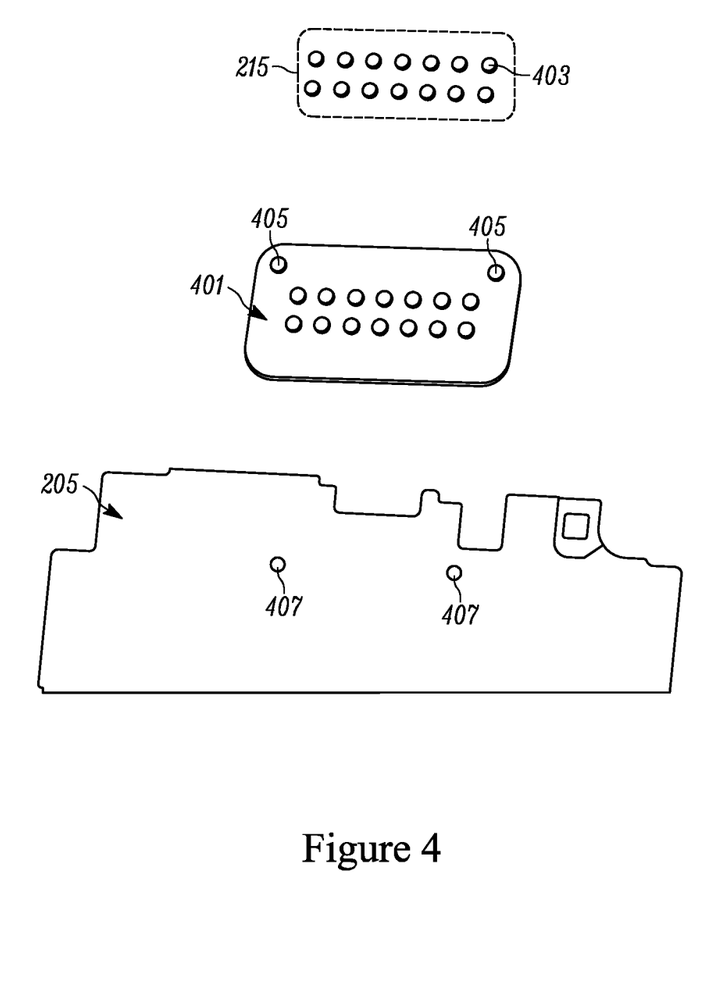
FIG. 4 is an exploded view of an assembly having a printed circuit board, a contact carrier and a set of contacts in accordance with an implementation of the disclosed principles.

To this end, in an embodiment, a carrier 401 is provided for use in assembling the individual contacts 403 of the contact array 215 to the PCB 205 as shown in FIG. 4. The carrier 401 includes one or more pins 405 dimensioned and located to pin into corresponding holes 407 in the PCB 205.

The illustrated configuration is given as an example of the disclosed principles. Thus, although the example refers to pins 405 on the carrier 401 and holes 407 in the PCB 205, it will be appreciated that other configurations are usable as well. For example, it is also contemplated that the holes 407 may be located on the carrier 401 and the pins 405 may be located on the PCB 205. Thus, while this description refers to the former configuration in the figures, suitable alternative configurations will be apparent to those of skill in the art.

Figure 5:
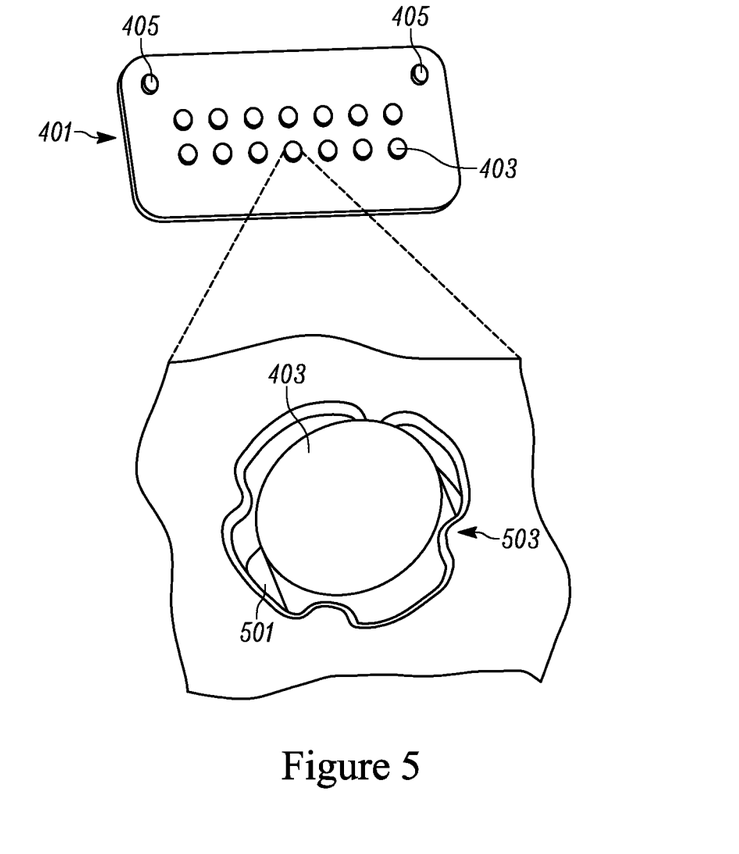
FIG. 5 is a perspective view of an enlarged section of the contact carrier in accordance with an embodiment of the disclosed principles.

Turning to FIG. 5, this figure shows the contacts 403 of the array 215 installed in the carrier 401. In addition, the area around one contact 403 on the carrier 401 is enlarged to show an example method of retaining the contacts 403 in the carrier 401 during processing. In the illustrated example, the carrier 401 contains an opening 501 for each contact 403, with the opening 501 being larger than the contact 403 to loosely receive the contact 403. A plurality of stand-offs 503 are provided within the opening 501. The stand-offs 503 provide an interference fit, holding the contact 403 within the hole 501, and thus retaining the contact 403 in the carrier 401.

Figure 6:
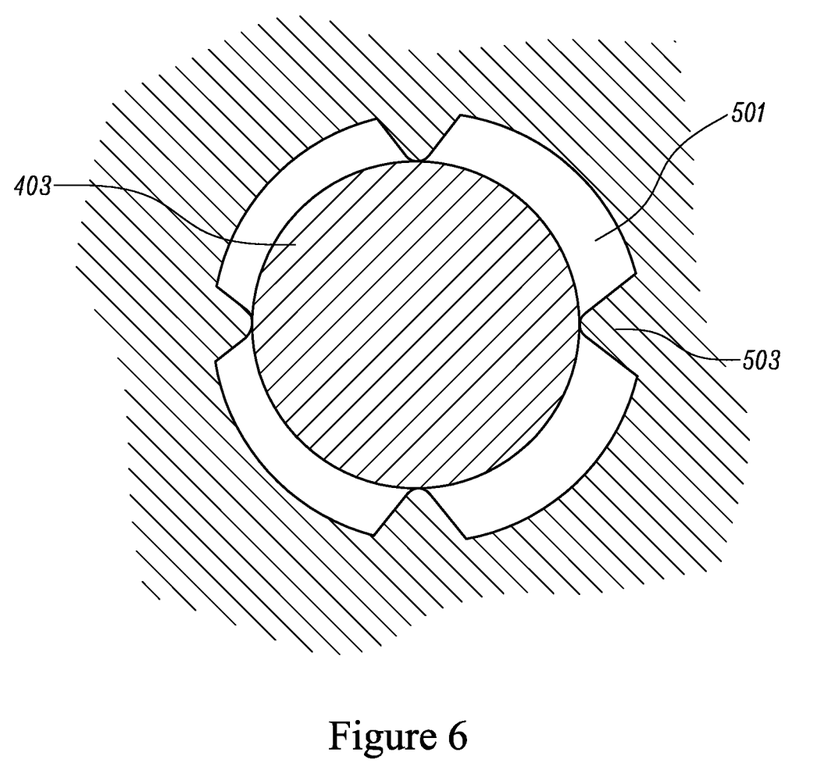
FIG. 6 is a schematic view of the enlarged section of the contact carrier of FIG. 5 in accordance with an embodiment of the disclosed principles.

To better illustrate the arrangement, the contact 403, hole 501 and stand-offs 503 are illustrated schematically in FIG. 6. The ratio of the diameters of the hole 501 and contact 403 has been exaggerated for clarity, and will typically be lower as there is no need for significant clearance between the contact 403 and the sides of the hole 501.

In the illustrated embodiment, each contact 403 is pressed into the carrier 401. However, other attachment methods such as a low tack adhesive are possible as well. Each contact's solder surface is taller than the surface of the carrier 401 to ensure good solder coverage on the contact 403 without interference from the carrier 401.

Figure 7:
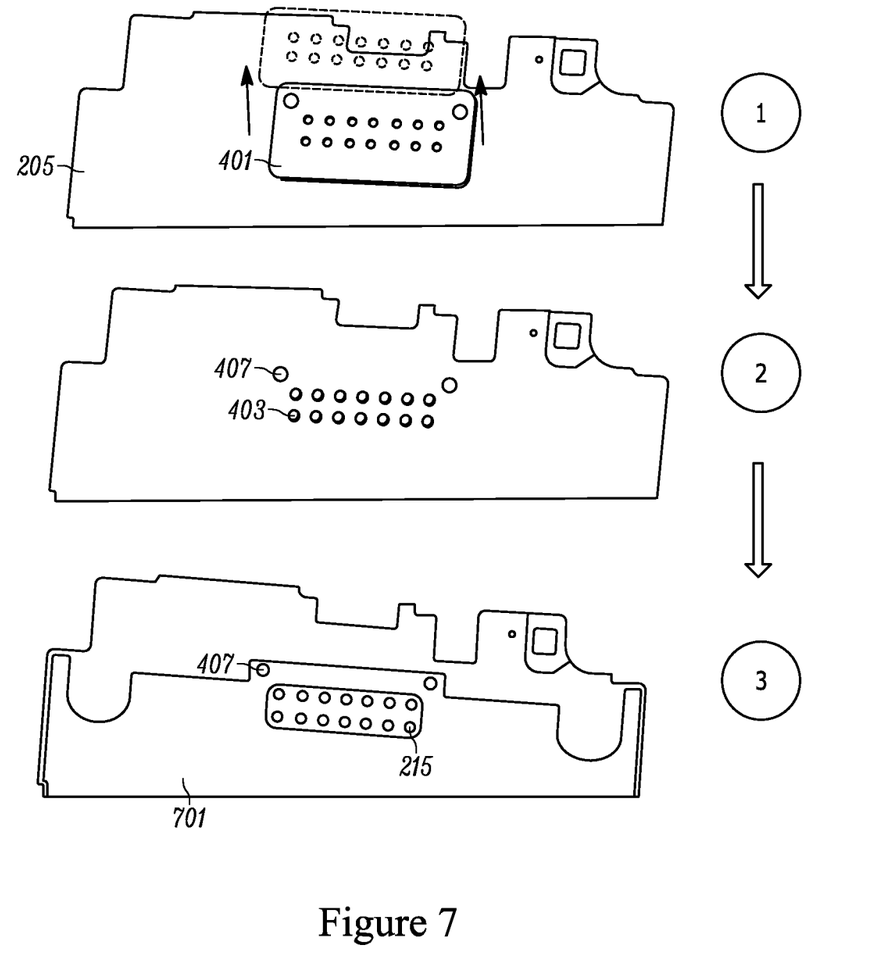
FIG. 7 is a staged perspective view showing preparation of a printed circuit board for installation on a device housing in accordance with an embodiment of the disclosed principles.

An example sequence showing the use of a carrier 401 to affix the array 215 of contacts 403 to the PCB 205 is shown in the staged process diagram of FIG. 7. At stage 1, the carrier 401 having the contacts 403 therein is placed on the PCB 205, with the pins 405 (not shown here) of the carrier 401 being keyed into the holes 407 (not shown here) on the PCB 205 for alignment of the contacts 403 with corresponding contacts on the PCB 205.

Further, the entire assembly is processed through a solder step to solder the contacts 403 to the underlying contacts of the PCB 205. The carrier 401 is then removed, leaving the contacts 403 on the PCB 205 at stage 2. At this point, the contacts 403 are protruding from the PCB 205.

The PCB 205 is then coated with an adhesive layer 701 at stage 3, with the adhesive layer 701 being applied around but not over the contact array 215. The adhesive layer 701 will later be used to adhere the PCB 205 to the device housing 201. However, as noted above, the contacts 403 must not only properly align with the PCB 205 during soldering, but also with openings in the housing 201 during assembly of the device.

Figure 8:
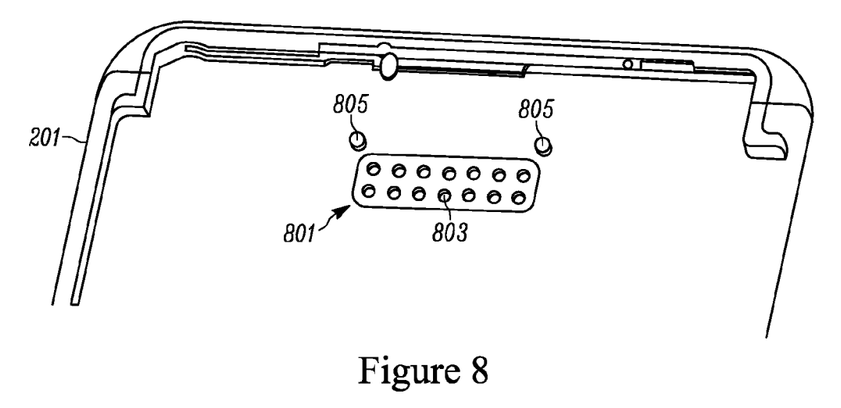
FIG. 8 is a partial inner view of a device housing prepared for installation of a printed circuit board configured in accordance with an embodiment of the disclosed principles.

As shown in FIG. 8, the housing 201 includes an insulating plate 801, e.g., made of plastic, in the rear surface of the housing 201. The plate 801 includes holes 803 arranged in the plate 801 to mirror the positions of the contacts 403 on the PCB 205. In an embodiment of the disclosed principles, the plate 801 is affixed to the housing 201 in whole form, while in an alternative embodiment, the plate is molded in place on the housing 201.

The housing 201 includes two pins 805 of essentially the same size and separation as the pins 405 on the carrier 401. Moreover, the pins 805 are situated in the same relationship to the holes 803 in the plate 801 as the pins 405 of the carrier bear with respect to the holes 403 in the carrier 401. Given this, when the PCB 205, with contacts 403 affixed and adhesive layer 701 applied, is placed into the housing 201, with the holes 407 in the PCB 205 over the pins 805 of the housing, each of the contacts 403 will extend into a hole 803 in the housing plate 801. The adhesive layer 701 then affixes the PCB 205 to the inside of the rear surface of the housing 201.

Figure 9:
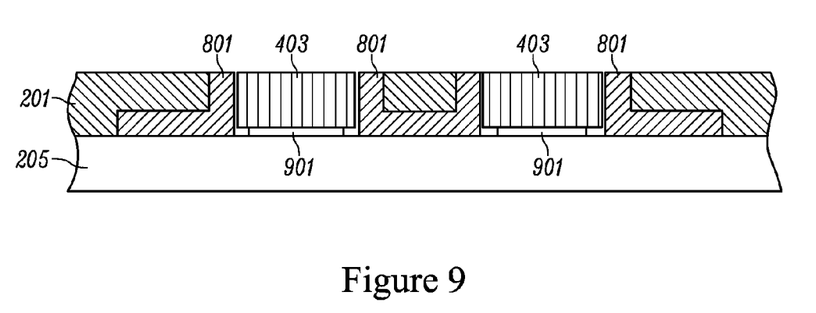
FIG. 9 is a cross-sectional side view showing components of an installed contact system in accordance with an embodiment of the disclosed principles.

With the PCB 205 assembled to the housing 201, the contacts 403 are insulated from the housing 201 but are exposed through the housing 201 to facilitate connection of the device to another device. An example placement of the elements in the assembled device is shown in cross-section in FIG. 9. As can be seen, the housing 201 and the plastic contact plate 801 are in contact with the PCB 205 in the assembled device. The adhesive layer 701 (not shown in FIG. 9) previously applied to the PCB 205 ensures continued close contact. The contacts 403 soldered on the PCB 205 extend outside the housing 201 by passing through the holes 803 (FIG. 8) in the plate 801.

In this way, reliable and accurate interconnection can be made between devices having similar arrays. In an embodiment, the array of one device includes contacts as shown, and the array of the connecting device includes contact springs or sprung contacts. A separate means may be provided of physically latching or locking the devices together.

It will be appreciated that a portable device interconnection system and related methods have been disclosed herein. However, in view of the many possible embodiments to which the principles of the present disclosure may be applied, it should be recognized that the embodiments described herein with respect to the drawing figures are meant to be illustrative only and should not be taken as limiting the scope of the claims. Therefore, the techniques as described herein contemplate all such embodiments as may come within the scope of the following claims and equivalents thereof.

We claim:

1. A printed circuit board (PCB) assembly for a portable device comprising:
   a PCB,
   a carrier having therein a plurality of holes;

a device housing; and a corresponding plurality of cylindrical contacts retained in the plurality of holes of the carrier, wherein the plurality of cylindrical contacts are retained by the carrier in a desired assembly position, wherein the carrier comprises a plurality of posts which protrude through a matching plurality of holes in the PCB, wherein the plurality of cylindrical contacts are retained in the carrier by a first force and are affixed to the PCB by a second force, and wherein the second force exceeds the first force, such that the carrier is removable from the assembly without dislodging the plurality of cylindrical contacts from the PCB prior to affixing the device housing to the PCB.

2. The PCB assembly in accordance with claim 1, wherein the plurality of cylindrical contacts are soldered to the PCB.

3. The PCB assembly in accordance with claim 1, wherein the plurality of cylindrical contacts are retained in the carrier by a press fit.

4. The PCB assembly in accordance with claim 1, wherein the housing includes an array of holes and two pins, such that at least one housing pin protrudes through one of the holes in the PCB to locate the PCB relative to the housing in the same configuration that the PCB was aligned to the carrier, allowing the plurality of cylindrical contacts to pass through the array of holes in the housing.

5. The PCB assembly in accordance with claim 1, wherein the housing is affixed to the PCB using an adhesive.

6. The PCB assembly in accordance with claim 5, wherein the adhesive surrounds the plurality of cylindrical contacts to form a water and dust seal between the housing and PCB.

7. The PCB assembly in accordance with claim 1, wherein the housing is made substantially of metal and comprises plastic overmolding to insulate the plurality of cylindrical contacts from the housing.

8. A method of making a printed circuit board (PCB) assembly for a portable device comprising:

retaining a plurality of cylindrical contacts in a carrier by a first force, the carrier including a plurality of holes for receiving the plurality of cylindrical contacts, and including a plurality of posts which protrude through a matching plurality of holes in a PCB, affixing the plurality of cylindrical contacts to the PCB by a second force that exceeds the first force while the plurality of cylindrical contacts remain in the carrier;

removing the carrier from the PCB without dislodging the plurality of cylindrical contacts from the PCB; and affixing a device housing to the PCB.

9. The method in accordance with claim 8, further comprising soldering the plurality of cylindrical contacts to the PCB.

10. The method in accordance with claim 8, wherein retaining the plurality of cylindrical contacts in the carrier by a first force comprises retaining the plurality of cylindrical contacts in the carrier by a press fit.

11. The method in accordance with claim 8, wherein the housing includes an array of holes and two pins, such that at least one housing pin protrudes through one of the holes in the PCB to locate the PCB relative to the housing in the same configuration that the PCB was aligned to the carrier, and wherein affixing the device housing to the PCB comprises allowing the plurality of cylindrical contacts to pass through the array of holes in the housing.

12. The method in accordance with claim 8, wherein affixing the device housing to the PCB comprises affixing the housing to the PCB with an adhesive.

13. The method in accordance with claim 12, wherein the adhesive surrounds the plurality of cylindrical contacts to form a water and dust seal between the housing and the PCB.

14. The method in accordance with claim 8, further comprising forming a plastic overmolding on the device housing, electrically insulating the plurality of cylindrical contacts from the housing.

\* \* \* \* \*